(12) United States Patent
Tate et al.

(10) Patent No.: US 7,161,455 B2
(45) Date of Patent: Jan. 9, 2007

(54) METHOD AND ARRANGEMENT FOR SECURING SENSORS IN AN ELECTRICITY METER

(75) Inventors: Ronald C. Tate, Battleground, IN (US); Paul Meyers, Fishers, IN (US)

(73) Assignee: Landis + Gyr Inc., Lafayette, IN (US)

( * ) Notice: Subject to any disclaimer, the term of this patent is extended or adjusted under 35 U.S.C. 154(b) by 87 days.

(21) Appl. No.: 10/772,226

(22) Filed: Feb. 3, 2004

(65) Prior Publication Data

US 2004/0243325 A1 Dec. 2, 2004

Related U.S. Application Data

(60) Provisional application No. 60/447,607, filed on Feb. 3, 2003.

(51) Int. Cl.
*H01F 27/02* (2006.01)
(52) U.S. Cl. .......................................... 336/90; 336/92
(58) Field of Classification Search .................. None
See application file for complete search history.

(56) References Cited

U.S. PATENT DOCUMENTS

| | | | | |
|---|---|---|---|---|
| 3,652,936 A | * | 3/1972 | Burkhart, Jr. | 324/137 |
| 4,121,147 A | * | 10/1978 | Becker et al. | 324/104 |
| 4,748,405 A | * | 5/1988 | Brodzik et al. | 324/127 |
| 4,754,368 A | | 6/1988 | Bullock et al. | |
| 5,001,420 A | | 3/1991 | Germer et al. | |
| 5,363,079 A | | 11/1994 | Zawada et al. | |
| 5,544,089 A | | 8/1996 | Hemminger | |
| 5,631,554 A | | 5/1997 | Briese | |
| 5,828,282 A | * | 10/1998 | Tiemann | 336/84 R |
| 5,933,004 A | | 8/1999 | Jackson et al. | |
| 5,966,101 A | | 10/1999 | Loy et al. | |
| 6,008,711 A | | 12/1999 | Bolam | |
| 6,112,158 A | | 8/2000 | Bond | |
| 6,275,168 B1 | | 8/2001 | Slater et al. | |
| 6,417,661 B1 | * | 7/2002 | Berkcan et al. | 324/117 R |
| 6,507,260 B1 | * | 1/2003 | Baumann et al. | 336/90 |
| 6,528,986 B1 | * | 3/2003 | Ballard | 324/158.1 |
| 2002/0101167 A1 | * | 8/2002 | Shan et al. | 315/111.11 |

OTHER PUBLICATIONS

U.S. Appl. No. 60/447,607, filed Feb. 3, 2003, Tate.
U.S. Appl. No. 10/772,161, filed Feb. 3, 2003, Tate.
U.S. Appl. No. 10/772,160, filed Feb. 3, 2003, Tate.

* cited by examiner

*Primary Examiner*—Anh Mai
(74) *Attorney, Agent, or Firm*—Maginot, Moore & Beck, LLP

(57) ABSTRACT

A current transformer assembly includes a current transformer and an insulation cup. The current transformer has a core and a first coil in a flux inducing relationship with the core. The core includes an opening defining a void configured to receive at least a second coil. The insulation cup includes a first part and a second part, the first part configured to mechanically couple to the second part such that the first part and the second part substantially encapsulate the current transformer. An interior portion of the insulation cup is disposed between the core and void.

20 Claims, 10 Drawing Sheets

METHOD AND ARRANGEMENT FOR SECURING SENSORS IN AN ELECTRICITY METER

This application claims the benefit of U.S. Provisional Patent Application Ser. No. 60/447,607 filed Feb. 3, 2003, which is incorporated herein by reference.

CROSS REFERENCE TO RELATE APPLICATIONS

Cross-reference is made to co-pending U.S. Patent Application Express Mail No. EV389959001US, filed Feb. 3, 2004, entitled "Method and Arrangement for Connecting Electrical Components in an Electricity Meter", and co-pending U.S. Patent Application Express Mail No. EV389959015US, filed Feb. 3, 2004, entitled "Utility Meter Housing Arrangement".

FIELD OF THE INVENTION

The present invention relates generally to arrangements for securing electrical components, and more particularly, to arrangements for securing electrical components within an electricity meter.

BACKGROUND OF THE INVENTION

Electricity meters, or simply meters, are devices, that among other things, measure electrical energy consumed by a residence, factory, commercial establishment or other such facility. Electrical utilities rely on meters for many purposes, including billing customers and tracking demand for electrical power. A common form of meter utilizes current transformers to sense the electrical current being supplied to the facility being metered. The current sensed by the current transformers is transmitted to circuit boards included in the meter to facilitate measurement of the amount of electrical energy being consumed by the facility.

A typical electricity meter includes several electrical components, ranging in size from relatively large power busses and transformers to microelectronic devices. Because of the variety of components within meters, labor and cost associated with assembling electricity meters can be a limiting factor in cost of electricity meters.

For example, electricity meters require heavy duty, thick copper current blades that are received by the meter housing to allow the meter to be coupled to the electrical power lines. These blades must in turn be connected to conductors, called current coils, that provide current signals to a current transformer within the meter. Moreover, voltage measurements are typically obtained from the current coils, thereby requiring connection to yet another, thinner lead wire that is also connected to a circuit board where the digital processing circuit is located. All of the various interconnections, for example, between the blade and the current coil, require complex bolt terminals or solder connections, which are labor intensive.

Another source of cost arises from the need to isolate the current transformers in electricity meters. As discussed above, electricity meters typically include one or more transformers that obtain low level current signals representative of the current flowing through the current coil. These low level current signals, combined with voltage measurements, allow for the power calculations to take place. The current transformers are typically in the form of a toroid, with the current coil passing through the center opening or void. A toroid, as is known in the art, is a circular or rounded core wrapped by a copper wire coil. Because the current transformer includes the bare wire coil, and is disposed in close proximity to the high voltage and current on the current coil, it is necessary to provide an insulation cover to inhibit dangerous arcing between the current coil and the current transformer wire coil.

In prior systems, the entire current transformer was coated with a heated, liquid, thermoplastic resin that cooled and hardened to form an insulation layer. In some cases, the current transformer was seated in a plastic insulating shell, and the thermoplastic resin was used to close off the shell. It has been found, however, that the use of the thermoplastic resin can be inconvenient and time consuming.

Accordingly, there exists a need for a method of providing an insulating cover for a current transformer that avoids one or more of the problems of the prior art discussed above, as well as others.

Moreover, as discussed above, the current coils of electricity meters typically carry a high voltage and/or high current. Such current coils are typically in the form of a bare copper wire or bare copper bar. If the current coils from different potentials of the power line are disposed too close to one another, a risk of arcing between two current coils may arise.

The nominal way to prevent such arcing consists of maintaining a significant minimum distance between the current coils. While maintaining distance between coils inhibits arcing, it often is not practical or cost effective. For example, it is possible in some cases to measure current from two different current coils using the same current transformer. However, passing both current coils within the same current transformer necessarily places the current coils within close proximity of each other.

As a consequence, there is a need for a more effective method of reducing the possibility of arcing between high voltage and/or high current carrying conductors in electricity meters.

SUMMARY OF THE INVENTION

The above needs are met by one or more of the inventive aspects described herein. One embodiment of the invention employs a mechanically-assembled current transformer cover that eliminates or at least reduces the need for thermoplastics or adhesives in insulating the current transformer. Another embodiment employs an arrangement that includes a post or protrusion disposed within a central opening of a current transformer. The post or protrusion may be used to inhibit arcing between two (or more) current coils passing through the central opening of the same current transformer. Such an arrangement eliminates the need for providing insulation on the current coils passing through the same current transformer in a cost effective manner.

A first embodiment of the invention is a current transformer assembly that includes a current transformer and an insulation cup. The current transformer has a core and a first coil in a flux inducing relationship with the core, the core including an opening defining a void configured to receive at least a second coil. The insulation cup comprises a first part and a second part, the first part configured to mechanically couple to the second part such that the first part and the second part substantially encapsulate the current transformer. An interior portion of the insulation cup is disposed between the core and void.

Another embodiment of the invention is a method of assembling a current transformer assembly. The method includes disposing a current transformer between a first part and a second part of an insulation enclosure, the current transformer having a core and a first coil in a flux inducing relationship with the core, the core including an opening defining a void configured to receive at least a second coil. The method further includes mechanically coupling the first part to the second part to substantially encapsulate the current transformer, an interior portion of the insulation enclosure disposed between the core and void.

A third embodiment of the invention is an arrangement that includes a current transformer, first and second current coils, and an insulation member. The current transformer has a core and a first coil in a flux inducing relationship with the core, the core including an opening defining a void. The first and second current coils pass through the void. The insulation member is disposed between the first current coil and the second current coil, the insulation member structurally separate from the first current coil and the second current coil.

The above discussed features and advantages, as well as others, will become more readily apparent to those of ordinary skill in the art by reference to the following detailed description and accompanying drawings. One or more inventive aspects described herein will have usefulness and provide advantages outside of the electricity metering industry.

BRIEF DESCRIPTION OF THE DRAWINGS

FIG. 10a is an enlarged fragmentary view of a portion of the upper housing, measurement and display circuit of FIG. 10;

DETAILED DESCRIPTION

Figure 1:
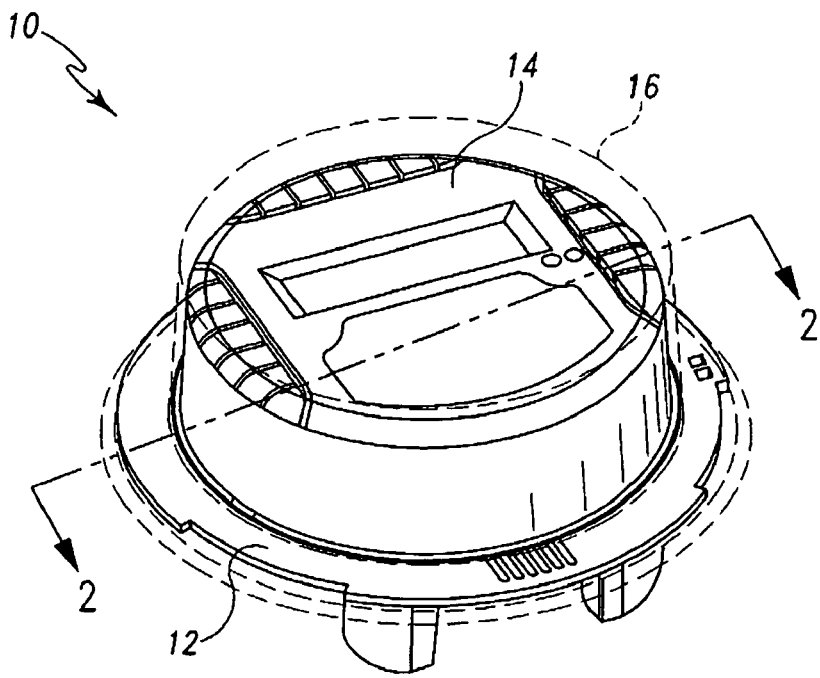
FIG. 1 is a perspective view of an exemplary electric utility meter which incorporates the features of the present invention therein.
Figure 2:
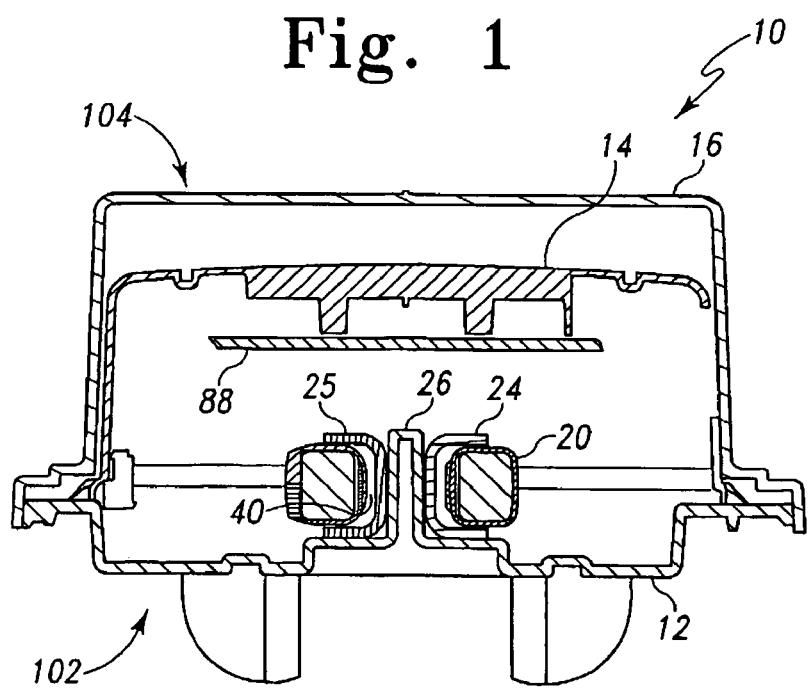
FIG. 2 is a cutaway view of the electrical utility meter of FIG. 1 taken along line II—II.

Referring now to FIGS. 1 and 2, there is shown an exemplary embodiment of an electric utility meter 10 which incorporates the features of the present invention therein. The electric utility meter 10 in the embodiment described herein is a residential meter having an electronic measurement circuit and an electronic display. However, it will be appreciated that many of the inventive aspects described herein may readily be adapted for use in polyphase meters used for non-residential purposes.

Figure 2A:
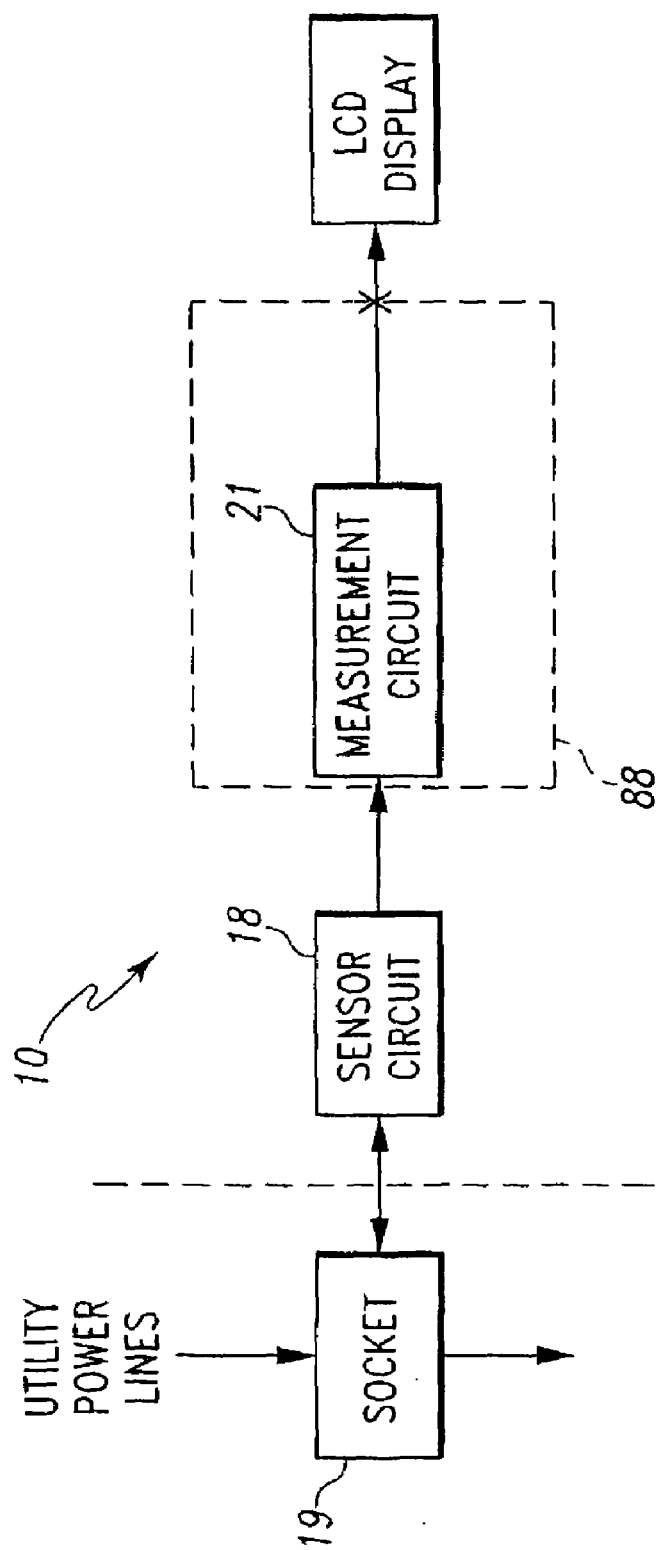
FIG. 2a is a schematic block diagram of the meter of FIG. 1.
Figure 9:
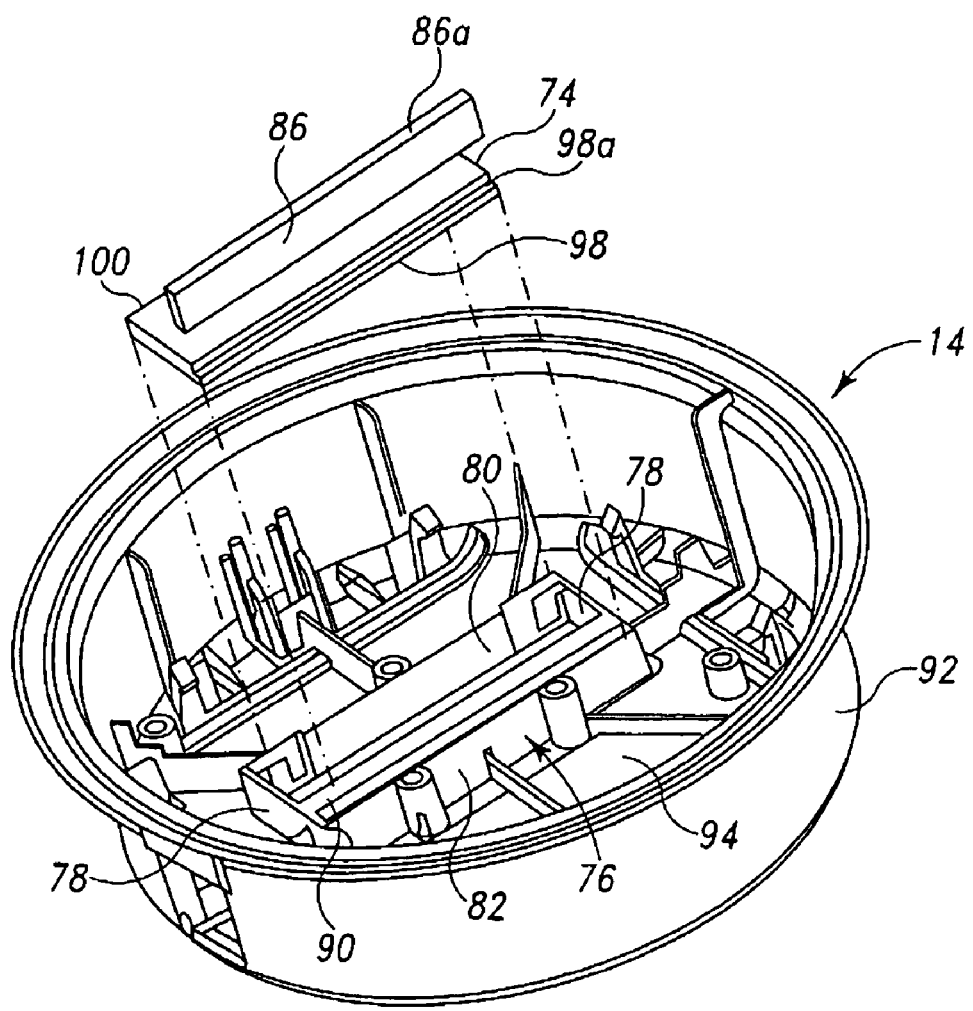
FIG. 9 is an enlarged, exploded, perspective view of an upper housing and display assembly of the meter of FIG. 1.

In general, the electric utility meter 10 has a housing that comprises a lower housing 12, an upper housing 14 and a cover 16. The lower housing 12 supports a sensor circuit 18 that attaches to a standard meter socket, not shown (see socket 19 of FIG. 2a). The upper housing 14 supports a circuit board 88 and a liquid crystal display ("LCD") 74 (see FIGS. 9 and 10). The circuit aspects of the meter 10 are shown schematically in FIG. 2a.

Figure 3:
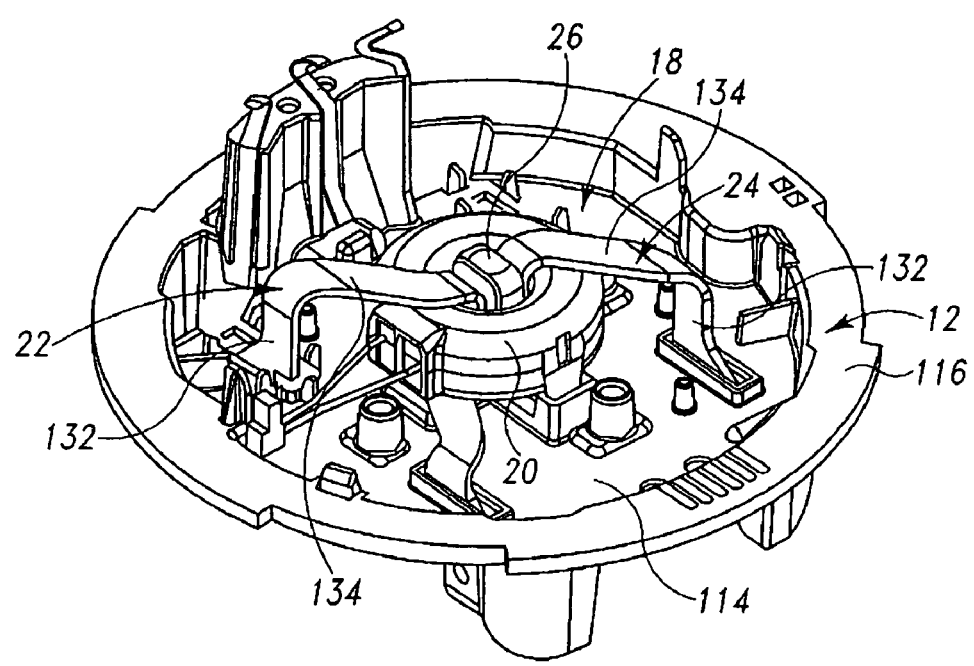
FIG. 3 is an enlarged perspective view of a lower housing and sensor circuit of the meter of FIG. 1.

The sensor circuit 18 is a circuit operable to generate signals representative of voltage and current on the electrical system being metered. To this end, as shown in FIGS. 2 and 3, the sensor circuit 18 includes a current transformer assembly 20 and first and second current coils 22 and 24, respectively. The first and second current coils 22 and 24 electrically connect to the electrical system being metered.

Referring again to FIG. 2a, the sensor circuit 18 provides the voltage and current signals to a measurement circuit 21, which is disposed at least in part on the circuit board 88. The measurement circuit 21 generates energy consumption information, for example, kilowatt-hours, VAR-hours, VA-hours, RMS voltage and/or current, relating to the electrical system to which the meter 10 is attached. The measurement circuit 21 provides at least some of the energy consumption information to the LCD 74. Any suitable measurement circuit may be used, including those generally described in U.S. Pat. No. 6,112,158; U.S. Pat. No. 5,631,554 and U.S. Pat. No. 5,544,089, which are incorporated herein by reference. While the above-listed patents describe polyphase meters, the measurement circuits described therein may readily be adapted for single phase use by one of ordinary skill in the art. It is noted that in other embodiments the display 74 need not be an LCD display, but may be another suitable form of display. Some embodiments may include communication circuits within the meter 10 that communicate metering information with local and/or remote devices, not shown. Such circuits are varied and are well known in the art.

In general, the sensor circuit 18 operates in the following manner to generate voltage and current measurement signals. As discussed above, in a typical meter installation, the current coils 22 and 24 are series-connected within the power lines of the facility being metered, not shown. In other words, all of the current drawn by the facility passes through the current coils 22 and 24. The current transformer assembly 20 includes a current transformer 34 (see FIG. 8) which is disposed in a current sensing relationship with respect to the current coils 22 and 24. The current transformer 34 (see FIG. 8) within the current transformer assembly 20 generates a scaled down version of the current passing through the current coils 22 and 24. The scaled down current constitutes the current measurement signal, which is provided to the measurement circuit 21 on the circuit board 88. (See FIG. 2a).

In addition, each of the current coils 22 and 24 of the sensor circuit 18 is connected to the circuit board 88 to provide a voltage measurement signal to the measurement circuit 21. As discussed below in connection with FIG. 5, a measurement contact assembly according to one aspect of the present invention, such as the measurement contact assembly 64 of FIG. 5, may be used to electrically connect the current coils 22 and 24 to contacts of the measurement circuit 21 on the circuit board 88. In this example, the voltage measurement signal constitutes the actual voltage on the power lines.

The measurement circuit 21 then performs energy related calculations to generate metering information from the current measurement signal and the voltage measurement signal. As discussed above, measurement circuits operable to perform such calculations are well known in the art.

In accordance with the one embodiment of the present invention, the components of the sensor circuit 18 are secured to the lower housing 12 in a manner that facilitates simplified manufacturing techniques, lower part counts, and ease of post-manufacturing servicing. To this end, as described below, the exemplary meter 10 includes novel current coil arrangements and a novel current transformer assembly in accordance with various inventive aspects. It will be appreciated, however, that at least some advantages may be achieved by incorporating individual aspects described herein apart from the others. For example, the novel current transformer arrangement provides at least some advantages even if other current coil arrangements are employed, and the novel current coil arrangements provided advantages regardless of whether the novel current transformer arrangement is employed. Still other advantages provided by housing and display mounting features may be incorporated alone or with other inventive features described herein.

Further detail regarding the lower housing 12 and the sensor circuit 18 is provided in connection with FIGS. 3, 4, 5 and 6. The lower housing 12 includes a bottom floor or bottom support 114 surrounded by a peripheral flange or shelf 116. As shown more clearly in FIG. 5, the lower housing 12 includes a number of integrally formed features, such as, for example, a current transformer seating structure 118. The current transformer seating structure 118 in the embodiment described herein includes four elevated platforms arranged in the form of a cross. In the center of the current transformer seating structure 118 is an isolation member 26 that is roughly in the shape of an upright tablet. (See FIGS. 5 and 6).

As shown in FIG. 2, 3, 4 and 6, the isolation member 26 has a height h sufficient to extend through a void 40 defined in the center of the current transformer assembly 20 when the assembly 20 is mounted in the current transformer seating structure 118. The isolation member 26 also has a width w that is slightly smaller than the diameter of the void 40 such that isolation member 26 fits within the void 40. The width w is also as wide as or wider than the width of portions of the current coils 22 and 24 that pass through the void 40. The isolation member 26 is made from an insulating material such as a plastic material. Indeed, the entire lower housing 12, including the integrally formed isolation member 26, may be formed of a plastic material. To this end, it will be appreciated that the exemplary embodiment of the isolation member 26 in FIGS. 2, 3, 4, 5 and 6 does not contain any overhang features that complicate injection molding processes. In other words, the isolation member 26 stays the same width and/or thickness, or becomes monotonically less wide and/or less thick, moving from the end of the isolation member 26 that couples to the housing 12 to the opposing end.

In other embodiments, the isolation member 26 may include layers or other portions that are made from different materials, or have overhangs or other features. However, such embodiments would include an insulating material portion having the height h and width w.

In particular, as discussed above, the current transformer 34 (see also FIG. 8) is in a current sensing relationship with coils 22 and 24. To this end, a portion of the current coils 22 and 24 also passes through the void 40 on opposite sides of the isolation member 26. (See FIGS. 3 and 4). The width w of the isolation member 26 preferably exceeds the corresponding width of the portions of the current coils 22 and 24 that pass through the void 40 in order to inhibit electrical arcing between those portions of the current coils 22 and 24.

The thickness of the isolation member 26 (as shown in FIG. 1) is chosen such that when the isolation member 26 is disposed within the void, adequate space remains between each side of the isolation member 26 and the current transformer assembly 20 to allow one of the current coils 22 and 24 to pass therethrough.

It will be appreciated that one of the advantages of the use of the isolation member 26 is that the current coils 22 and 24 may both pass through the void 40 of a single current transformer without unduly increasing the possibility of arcing. To this end, the isolation member 26 interferes with the arc path in substantial manner. The isolation member 26 may take other forms and shapes, so long as it generally has a width profile that is at least coextensive with at least one of the current coils 22 and 24. It is also of significant cost advantage that the isolation member 26 is structurally independent from the current coils 22 and 24. In particular, attempting to form an isolation layer directly on one or both of the current coils adds to the complexity of the coil forming process. Moreover, if the isolation member 26 is integrally molded with the base 12, then it may be added at minimal cost.

As discussed above, voltage measurement signals are provided directly from the current coils 22 and 24 to the circuitry, not shown, on the circuit board 88. To this end, the current coils 22 and 24 each include measurement contact assemblies or devices such as the assembly 64 shown in FIG. 5.

Figure 5:
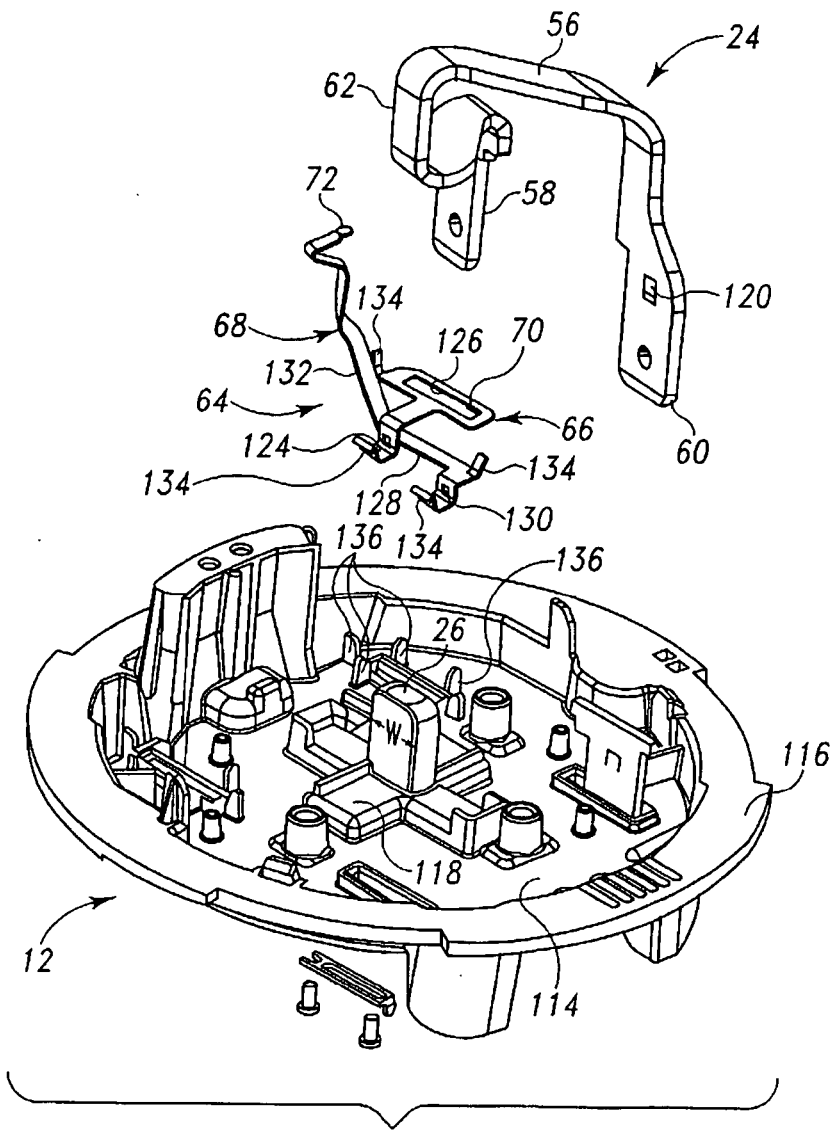
FIG. 5 is an enlarged, partially exploded view of the lower housing, a current coil and a measurement contact assembly of the meter of FIG. 1.
Figure 6:
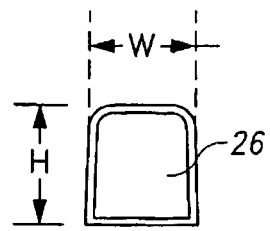
FIG. 6 is a side plan view of an isolation member of the meter of FIG. 1 shown apart from the meter.

Referring now to FIG. 5, there is shown an exploded perspective view of the coil 24 and its corresponding measurement contact assembly 64. The current coil 24 is a high current carrying conductor having a middle portion 56 disposed between contact blades 58 and 60. The contact blades 58 and 60 have a structure suitable for use in a standard meter socket connection. Such devices are known in the art. Thus, the structure of the contact blades 58 and 60 have a thickness, length and width sufficient to ensure connection to the meter socket connection and a robustness to withstand the significant force generally required to insert the blades 58 and 60 into the socket.

Figure 4:
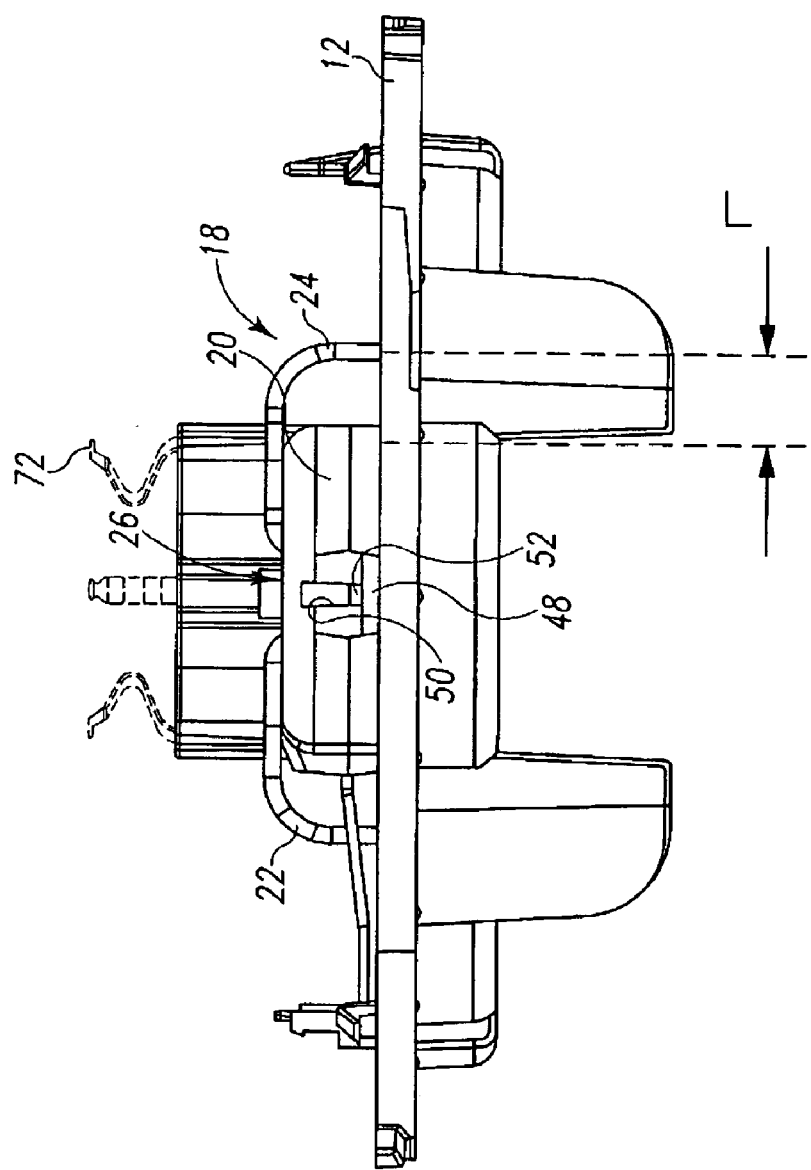
FIG. 4 is an enlarged side plan view of the lower housing and sensor circuit of the meter of FIG. 1.
Figure 5A:
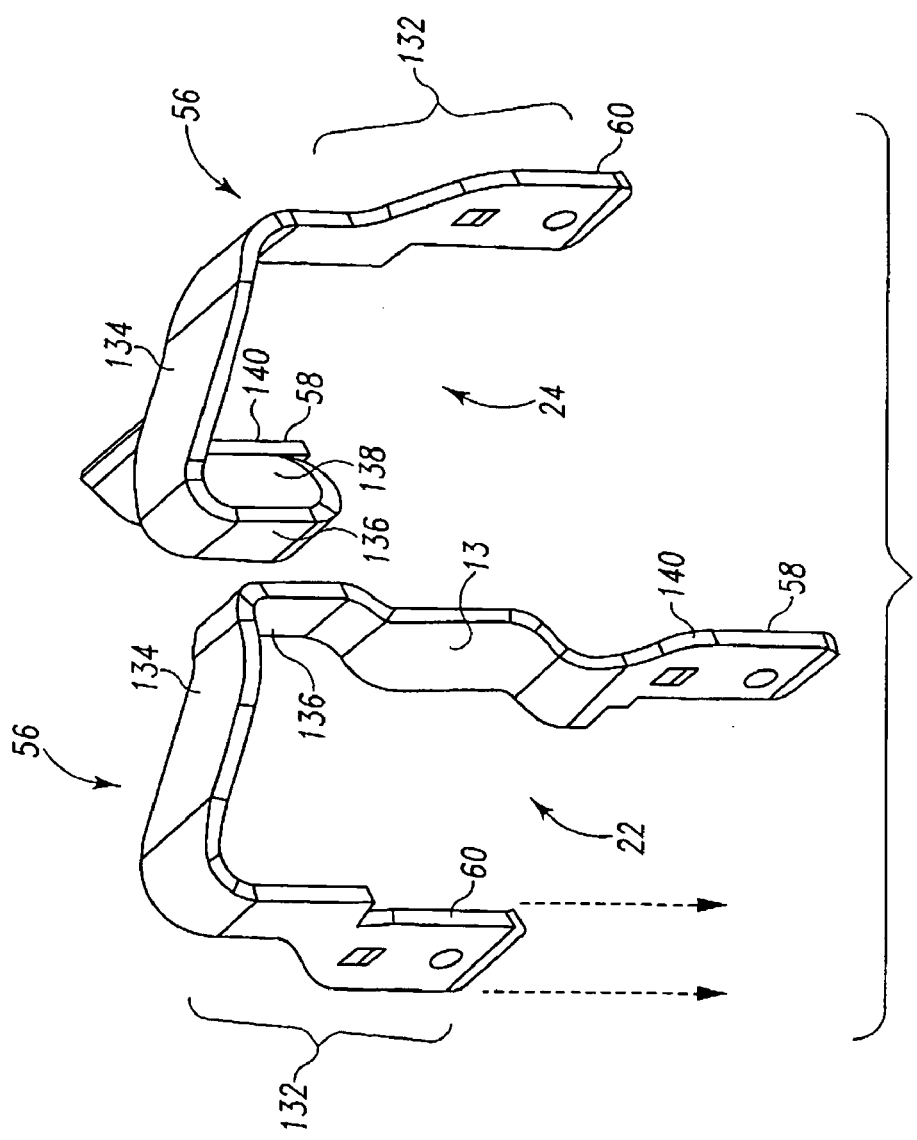
FIG. 5a is a perspective view of two current coils of the meter of FIG. 1 shown apart from the meter.

As shown in FIGS. 5 and 5a, the middle portion 56 preferably is formed as a bent copper bar, and thus may be formed as a single integrally formed structure that includes the blades 58 and 60. Referring to FIGS. 3, 4, and 5, the blades 58 and 60 extend through openings in the bottom support 114 (not in view) so that the blades 58 and 60 stick out from the bottom support 114 at positions defined by normal meter sockets.

As shown in FIGS. 5 and 5a, the middle portion 56 of the current coil 24 extends upward from the blade 58 in a direction perpendicular to the plane of the bottom support 114, and then bends to extend primarily parallel to the plane of the bottom support 114 and generally toward the void 40. At the position of the void 40, the middle portion 56 again bends to extend perpendicular to the bottom support and specifically up through the void 40. After passing through the void 40, the middle portion 56 bends to extend substantially parallel to the bottom support 114 towards the blade 60. At about the position of (but vertically displaced from) the blade 60, the middle portion 56 bends to extend perpendicular to the bottom support 114 towards and into the blade 60. The middle portion 56 thus includes multiple bends that allow it to extend to and through the void 40. As a consequence, the middle portion 56 is non-symmetrical about its midpoint 62.

Also formed in the current coil 24 is a punch and pushback crimping element 120 at the top of the blades 58 and 60. The element 120 is configured to catch the bottom (or some other feature) of the bottom support 114 to inhibit axial (e.g. outward) dislodging of the current coil 24. The element 120 may suitably be crimped outward during final assembly.

FIG. 5a shows in further detail the design of the current coils 22 and 24 apart from the other elements of the meter 10, but generally in the relative positions in which they would be disposed within the meter 10. Preferably, the current coil 22 preferably has an identical design to that of the current coil 24, such that the current coils 22 and 24 are interchangeable. However, the current coils 22 and 24 are mounted in opposing directions, as is shown in FIG. 3. Because the current coils 22 and 24 are identical, like numbers will reference identical elements of both.

Each of the current coils 22 and 24 has a first axial section 132 that includes the current blade 60. The first axial section 132 has a length extending in the axial direction with respect to the meter 10. In other words, the first axial section 132 extends vertically when the meter 10 is lying flat as shown in FIGS. 4 and 5.

Each of the current coils 22 and 24 further includes an upper radial section 134 having a length extending in a first radial direction from the first section 132. By radial, it is meant that the current coils extend generally in a horizontal manner parallel to the bottom support 114 and roughly toward the center of the bottom support 114 (see also FIG. 3). As shown in FIG. 5a, the upper radial section 134 need not extend purely radially, although it may. Instead, as with the embodiment of FIG. 5a, the upper radial section may include an axial incline.

Each of the current coils 22 and 24 also includes a center axial section 136 having a length extending in the axial direction between the upper radial section 134 and a lower radial section 138, discussed further below. The center axial section 136 is the section that passes through the void 40 of the current transformer assembly 20, as shown in FIG. 3.

The lower radial section 138 has a length extending at least in a second radial direction from the center axial section 136. By "second radial direction", it is meant that the lower radial section 138 extends generally radially, similar to the upper radial section, but in a different angular direction from (or to) the center axial section 136. As with the upper radial section 134, the lower radial section 138 may extend at least partially axially as well as primarily radially.

Each of the current coils 22 and 24 has a second axial section 140 that includes the current blade 58, and has a length that extends in the axial direction from the lower radial section 138.

While the blades 22 and 24 need not have the exact layout as that described above, the above described layout is particularly well-suited to combine the advantages of using a single reversible design for both blades 22 and 24 with advantages related to the having flat horizontal or radial sections 134 and 138 which are particularly space efficient in meters.

Another feature of the embodiment described herein is the simplified structure that conveys voltage potential measurements from the current coils 22 and 24 to the circuit board 88 (and to the measurement circuit 21 disposed thereon).

Referring again to FIG. 5, the measurement contact assembly 64 is an assembly that effectuates an electrical contact between the current coil 24 and the circuit board 88 that is disposed within the upper housing 14 in the final meter 10. In the exemplary embodiment described herein, the assembly 64 includes a blade contact portion 66 and a circuit board contact portion 68. In the embodiment described herein, the blade contact portion 66 and the circuit board contact portion 68 are formed as separated structures, but need not be. In other words, the portions 66 and 68 may be formed as a single structure.

In the embodiment describe herein, the blade contact portion 66 includes an anchor portion 122 having a fastener receiving structure 124 and an opening 126. The blade contact portion 66 further includes a flexible member 70 extending from the anchor portion into the opening 126. The blade contact portion 66 preferably includes a further flexible member, not shown in FIG. 5, located opposite the flexible member 70 and also extending from the anchor portion 122 into the opening 126.

The circuit board contact portion 68 also includes an anchor portion 128 and a fastener receiving structure 130. The portion 68 also includes a vertical extension 132 which terminates in a spring terminal 72. The spring terminal 72 is configured to make a contact against a circuit board contact, not shown, but which may be any suitable contact terminal, on the circuit board 88 mounted in the upper housing 14.

The anchor portion 122 is disposed on the bottom support 114, or on features located on the bottom support 114, such that the opening 126 is aligned to receive a portion of the current coil 24 (near the blade 58) therethrough. The flexible member 70 (and the opposing flexible member) engage and are biased towards the current coil 24.

The anchor portion 128 of the circuit board contact portion 68 is located at least in part between the anchor portion 122 and the bottom support 114, such that the anchor portions 122 and 128 partially coextend and electrically contact each other. The anchor portions 122 and 128 also include a number of flexible tabs 134 that engage corresponding anchor posts 136 formed in the lower housing 12. The anchor posts 136 extend upward from the bottom support 114. The engagement of the tabs 134 in the posts 136 assist in securing the assembly 64 to the lower housing 12. Fasteners from underneath the bottom support 114 also secure the assembly 64 by engaging the fastener receiving structures 124 and 130.

The blade contact portion 66 and the circuit board contact portion 68 are preferably formed from a flexible, conductive metal. The flexibility allows the flexible member 70, the tabs 134 and the spring terminal 72 to use spring bias to aid in securing the assembly 64 and in effecting electrical contact between the current coil 24 and the circuit board 88.

The electrical contact path from the current coil 24 to the circuit board 88 starts at the flexible member 70 (and the opposing flexible member) of the anchor portion 122 of the blade contact portion 66. The path continues through the anchor portion 122 and via pressure contact to the anchor portion 128 of the circuit board contact portion. The path continues from the anchor portion 128 up through the vertical extension 132 to the spring terminal 72.

A substantially similar (or at least mirror image) measurement contact assembly may be used to provide electrical contact between the current coil 22 and the circuit board 88.

Many advantages may be realized from the design of the current coil arrangement described above. The current coils 22 and 24, by employing identical designs, are more economically stocked and distributed during manufacturing. Moreover, the use of an measurement contact assembly such as the one described above provides a substantially solderless connection between the sensor elements, which cannot be mounted on the circuit board 88, and elements that are mounted on the circuit board 88. The solderless connection reduces manufacturing expense. While both advantages reduce cost and increase convenience, either advantage may be obtained without the other.

Figure 7:
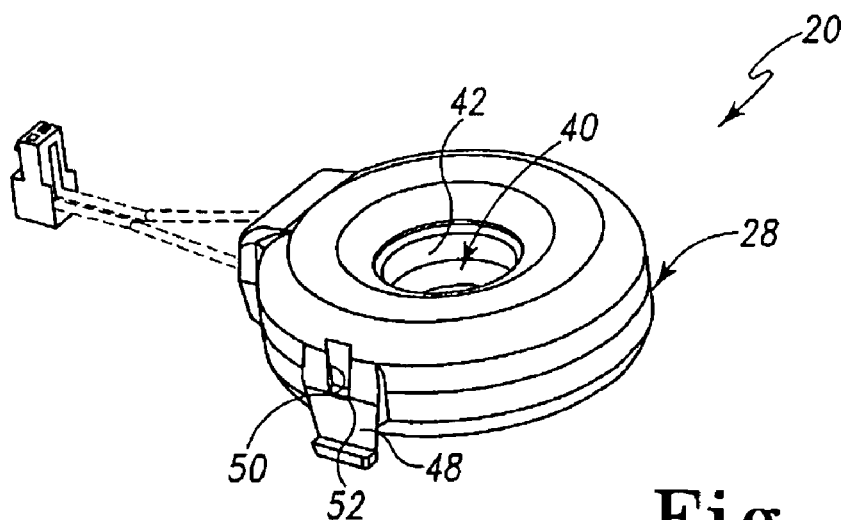
FIG. 7 is an elevated perspective view of an exemplary embodiment of a current transformer assembly in accordance with an aspect of the present invention.
Figure 8:
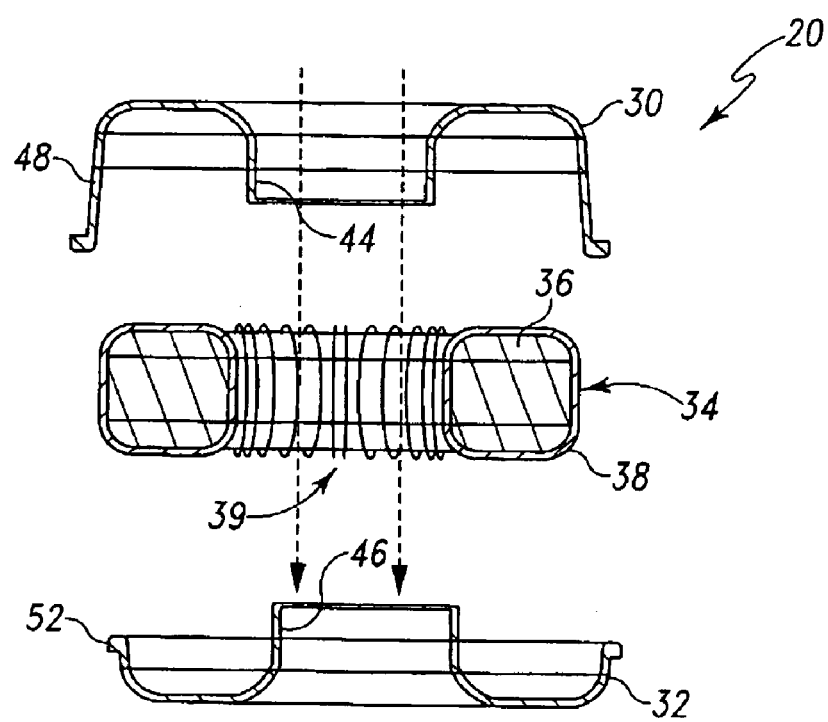
FIG. 8 is an exploded, cutaway view of the current transformer assembly of FIG. 7.

FIGS. 7 and 8 provide further detail regarding an exemplary current coil assembly 20 that may be used in accordance with aspects of the invention. The current transformer assembly 20 includes a current transformer 34 and an insulation cup 28. The current transformer 34 has a core 36 and a first coil in the form of a winding 38. The winding 38 is in a flux inducing relationship with the core 36. The core 36 includes an opening 39 defining the void 40. As discussed above, the void 40 in the embodiment described herein is configured to receive a portion of the current coils 22 and 24, as well as the isolation member 26.

In a typical embodiment, the current transformer 34 is in the form of a substantially circular toroid. The number of turns in the winding 38 correspond to the reduction ratio sought for current measurements. In particular, the current flowing through the current coils 22 and 24 is often the actual line current. The current transformer 34 reduces this relatively high current to one that is used by the measurement circuit 21 (see FIG. 2a) on the circuit board 88 to perform the energy-related calculations. Those of ordinary skill in the art may readily choose a suitable number of turns for the winding 38 based on the particular measurement circuitry employed.

The insulation cup 28 includes a first part 30 and a second part 32. The first part 30 is configured to mechanically couple to the second part 32 such that the first part 30 and the second part 32 substantially encapsulate the current transformer 34. As such, the first part 30 and the second part 32 define an interior portion 42 of the insulation cup 28 that is disposed between the core 36 and the void 40. The interior portion 42, among other things, interrupts the arc path between the winding 38 and/or core 36 and the current coils 22 and 24 passing through the void 40 (See FIG. 3). Thus, the interior portion 42 preferably defines a complete periphery around the void 40.

Moreover, because the parts 30 and 32 of the insulation cup 28 are mechanically coupled, there is a possibility of a seam between the parts facilitating an arc path between the current transformer 34 and the coils 22 and 24. To inhibit such an arc path, the first part 30 and the second part 32 are designed such that when mechanically coupled, as shown in FIGS. 3, 4 and 7, they form an overlapping area in the interior portion 42 of the cup 28. In the exemplary embodiment described herein, both the first part 30 and the second part 32 include overlapping sections 44 and 46, respectively, that form the overlapping area.

It is noted that the insulation cup 28 need not have the circular shape shown in FIGS. 3, 7 and 8 so long as it defines a void for receiving current coils. For example, the outer shape of the cup could be square or other non-circular shape.

The mechanical connection between the first part 30 and the second part 32 is accomplished via snap-together features on the parts 30 and 32. Thus, the first part 30 and/or the second part 32 includes a feature that is received by a corresponding feature in the other part, with elastic deformation required to allow the feature to traverse the corresponding feature. Once the corresponding feature is reached, the elastic deformation at least partially recovers to "snap" the features together. Such features may take many configurations and large numbers of variants would be known or readily devisable by those of ordinary skill in the art.

In the exemplary embodiment described herein, such features are embodied in a flexible tab 48 on the first part 30 and a detent 52 on the second part 32. As shown in FIGS. 7 and 8, the flexible tab 48 extends downward from an outer periphery of the first part and includes an aperture 50. The detent 52 is disposed on the outer periphery of the second part 32 and is configured to be received by the aperture 50. To this end, as the first part 30 is assembled onto the second part 32, the flexible tab 48 elastically deforms outward to allow the flexible tab 48 to traverse the detent 52. When the flexible tab 48 has moved over the detent 52 to a sufficient degree, the aperture 50 is aligned with the detent 52 and the flexible tab 48 snaps back such that the detent 52 extends into the aperture 50 to secure the first part 30 to the second part 32.

One or more other similar flexible tab, aperture and detent arrangements are provided on the first part 30 and the second part 32.

FIGS. 9, 10, 10a, 11 and 12 show the upper housing 14 of the meter 10, which incorporates other inventive aspects that may or may not be combined with one or more of the inventive aspects described above. In the embodiment described herein, the upper housing 14 includes a side wall 92 and an end wall 94, preferably integrally formed with one another. The housing side wall 92 is curved to form a cylindrical side wall, although multiple side walls may be joined to form a rectilinear volume rather than a cylindrical one. The side wall 92 and the end wall 94 define an interior volume of the upper housing 14.

One inventive aspect of the upper housing relates to an LCD mounting and/or connection arrangement illustrated in FIGS. 9, 10, 10a and 11. To this end, the meter 10 includes a display receptacle 76 is constructed within the upper housing 14 of the meter 10 to retain the LCD 74. The display receptacle 76 is mounted on the end wall 94 the interior of the upper housing 14. In a preferred embodiment, the display receptacle 76 is integrally molded with the end wall 94, side wall 92 and other structures within the upper housing 14.

In the embodiment described herein, the receptacle 76 is comprised of a first long side wall 80 and a second long side wall 82 that are joined at their outboard ends by short side walls 78 so that a generally rectangular display receptacle 76 is formed thereby. One of the side walls has a protrusion or detent 84 that engages LCD 74 to assist in the retention of LCD 74 within receptacle 76. It is noted that the detent 84 may be of various lengths and profiles.

An L-shaped rib 90 extends between short side walls 78. One leg 90a of L-shaped rib 90 extends laterally into the volume between walls 82 and 80 while the other leg 90b extends vertically downward into the receptacle 76. The rib 90 is offset from long side wall 82 so that a slot is defined between the downwardly extending leg 90b and long side wall 82. This slot receives and retains a flexible conducting strip 86, discussed further below. The rib 90 has a length that, preferably, is substantially the same length as the long side walls 80, 82 of the receptacle 76 and the cross-section of rib 90 is substantially identical throughout its length. While the rib 90 is shown as an L-shaped rib, it may include other shapes that are capable of supporting and retaining the flexible conducting strip 86 at an appropriate location within receptacle 76.

The LCD 74 has a generally rectangular shape, and includes a top surface 74a through which characters are visible, a first longitudinal edge 98 and second longitudinal edge 100. The first longitudinal edge 98 is beveled to produce a lengthwise cutout of the top surface 74, thereby creating an elongated contact surface 98a. The elongated contact surface 98a is below the level of the top surface 74a, and includes a plurality of electrical contacts, not shown. The LCD 74 is operable to provide display of characters in response to signals received at the contact on the top surface 74a. The length and width of the LCD 74 generally corresponds to the length and width of the receptacle 76.

The design of the receptacle 76 as described above facilitates assembly of the LCD 74 onto the upper housing 14. To assemble the LCD 74 onto the upper housing 14, the LCD 74 is placed at an angle within the receptacle 76 so that the beveled long edge 98 engages the side wall 82 beneath the downwardly extending leg 90b of the rib 90. It is noted that the leg 90b preferably terminates in a chamfered edge 90c to facilitate placement of the first long edge 98 under the leg 90b at an angle as described above.

Once the first long edge 98 is under the leg 90b and substantially against the side wall 82, the opposed edge 100 of the LCD 74 may then be rotated downwardly against the protrusion 84 so that the protrusion 84 snaps into place against the LCD 74. To this end, the protrusion 84 and or the wall 80 to which it is attached should have some amount of resilient flexibility. Likewise, the downwardly extending leg of rib 90 retains the first long edge 98 of the LCD 74 within the receptacle 76.

The flexible conducting strip 86, mentioned above, is a device known in the art that contains multiple electrical conductors disposed in an rubber-like polymer. Terminations of the conductors are disposed at edges 86a and 86b of the strip 86. The flexible conducting strip 86 in the embodiment described herein is employed to provide an electrical connection between the measurement circuit 21 on the circuit board 88 and the LCD 74.

Figure 10:
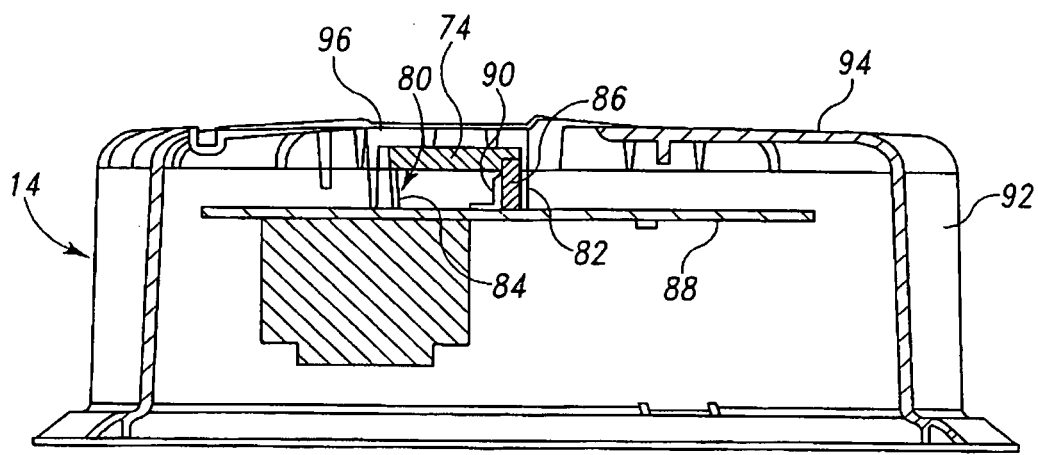
FIG. 10 is a cutaway view of the upper housing, measurement and display circuit of the meter of FIG. 1.
Figure 11:
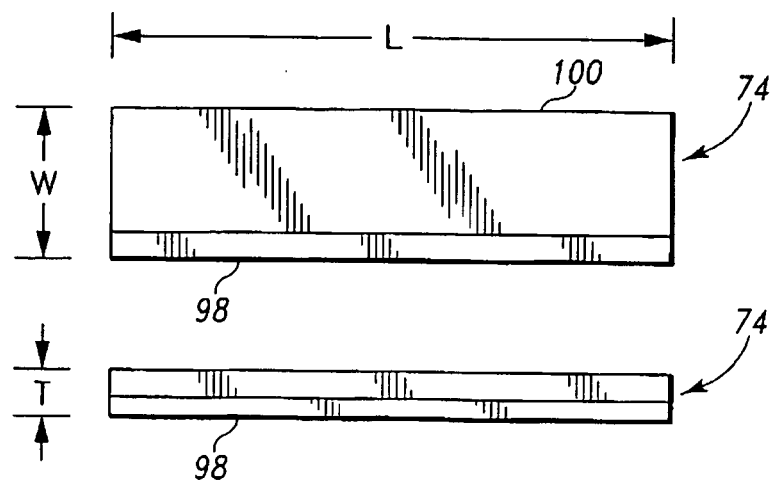
FIG. 11 shows top plan and side plan view of the liquid crystal display of the display circuit of FIGS. 9 and 10.
Figure 12:
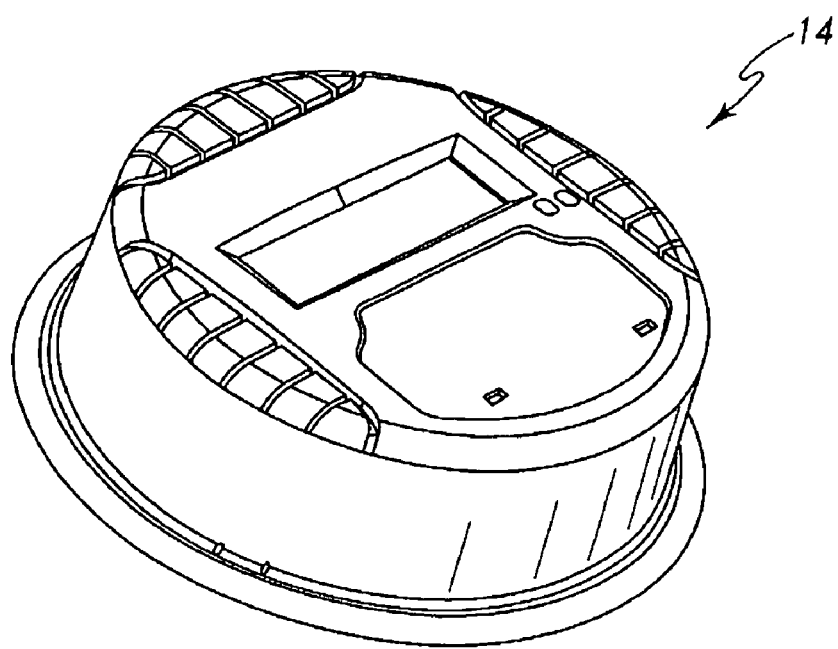
FIG. 12 shows an elevated perspective view of the upper housing of FIG. 10.

As shown in the cross-section view of FIGS. 10 and 10a, the flexible conducting strip 86 may be placed within the receptacle 76 so that the conducting strip 86 couples LCD 74 to a conductor on printed circuit board 88. The conducting strip 86 is placed within the slot that is formed between the downwardly extending leg 90b of the rib 90 and long side wall 82. The elongated contact surface 98a of the LCD 74 receives the edge 86b of the conducting strip 86 so an electrical coupling is established between the conductors within the strip 86 and the contacts of the LCD 74. Thereafter, printer circuit board 88 may be mounted so it is electrically coupled to the edge 86a of the conducting strip 86 and an electrical conducting path is thereby established between the LCD 74 and the printed circuit board 88.

In summary, the method for installing the LCD 74 within the receptacle 76 so it may be electrically coupled to the measurement circuit 21 (see FIG. 2a) on the printed circuit board 88 includes disposing a first edge 98 of the LCD 74 within display receptacle and under the rib 90 and rotating the second edge 100 of LCD 74 within display receptacle 76 while edge 98 remains disposed under the rib 90. Rotation of the long edge 100 temporarily moves the protrusion 84 until the edge 100 advances past the protrusion 84 and the protrusion 84 snaps back into a position that retains the LCD 74 within the receptacle 76. The flexible conducting strip 86 is disposed in the slot between rib 90 and long wall 82 so an edge of the flexible conducting strip 86 electrically contacts the contact surface 98a of the LCD 74.

Figure 13:
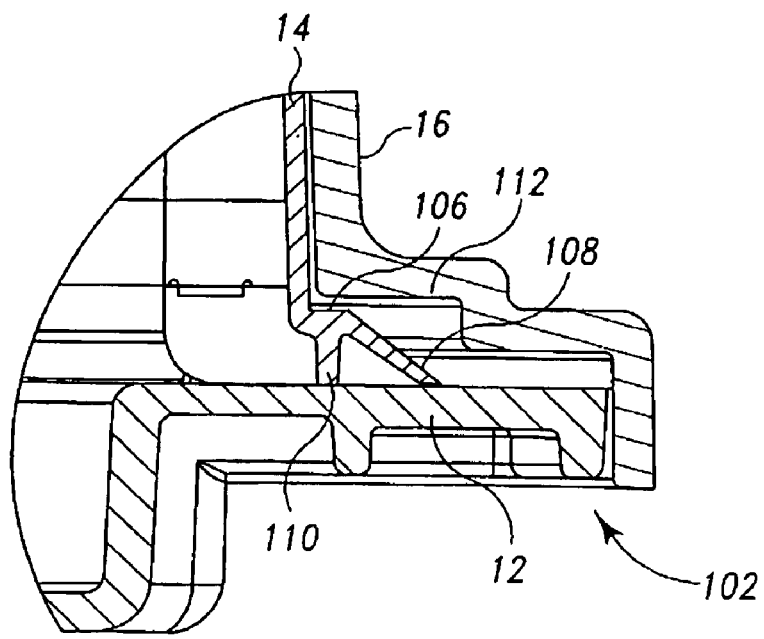
FIG. 13 shows an enlarged, fragmented view of a portion of the cutaway section of the meter of FIG. 2.

FIGS. 2 and 13 show in further detail another inventive aspect of the meter 10 that incorporates features of the upper housing 14. FIG. 13 is an enlarged detail drawing of a portion of FIG. 2. The inventive aspect includes an arrangement for sealing the meter 10. The arrangement includes the lower housing 12, which may suitably be replaced by any other type of meter base plate. The arrangement also involves the cover 16 and the upper housing 14. In general, there is a need to provide a weather proof seal to between the cover 16 and the electrical elements within the meter 10.

To this end, the cover 16 is preferably in the shape of an open cylindrical container, however, the principles described herein may be modified for use in rectangular or other shaped meters. In any event, the cover 16 includes an open end 102 and a closed end 104. At least the closed end 104 is sufficiently transparent to allow viewing of the LCD 74. Disposed at the periphery of the open end 102 is a shoulder 112.

The upper housing 14 also includes an outward extending shoulder 106 extending throughout its periphery. The upper housing 14 also includes at least one flexible extension, shown in FIG. 13 as flexible extensions 108 and 110, extending at an angle from the outward extending shoulder 106. In the exemplary embodiment described herein, the first flexible extension 108 extends at a non-perpendicular angle from the shoulder 106, while the second flexible extension 110 extends at a perpendicular angle from the shoulder 106.

To assemble the housing of the meter 10, the upper housing 14 is disposed on the lower housing 12 such that the flexible extensions 108 and 110 generally rest on the shelf 116 of the lower housing 12. The flexible extensions 108 and 110 coextend with the shelf 116 to entirely surround the electrical components of the meter in the plane defined by the shelf 116. The cover 16 is then placed over the upper housing 14 until its shoulder 112 engages the shoulder 106 of the upper housing 14. The cover 16 includes features that interlock with and secure to features on the lower housing 12. These features are shown in the drawings and are known in the art. However, when secured to the lower housing, the shoulder 112 applies downward force on the shoulder 106 of the upper housing 14. The downward force causes the flexible extensions 108 and 110 to press against the shelf 116, flexing somewhat. The spring action of the flexible extensions 108 and/or 110 form a weather seal in the meter 10.

With such a design, the need for a separate gasket between the cover and the base, as is typically used in meters, may be avoided. However, even if a gasket is employed, it will be appreciated that the design may alternatively merely enhance the effectiveness and/or lifespan of the gasket.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

We claim:

1. A current transformer assembly comprising:
   a current transformer having a core and a first coil in a flux inducing relationship with the core, the core including an opening defining a void configured to receive at least a second coil;

an insulation cup comprising a first part and a second part, the first part configured to mechanically couple to the second part such that the first part and the second part substantially encapsulate the current transformer, an interior portion of the insulation cup disposed between the core and void.

2. The current transformer assembly of claim 1, wherein the interior portion defines a complete periphery of the void.

3. The current transformer assembly of claim 2, wherein the interior portion is rounded.

4. The current transformer assembly of claim 1, wherein the interior portion includes an overlap portion defined by overlapping sections of the first part and the second part.

5. The current transformer assembly of claim 4, wherein the first part and second part includes complementary snap-fit features.

6. The current transformer assembly of claim 1, wherein the first part and second part includes complementary snap-fit features.

7. The current transformer assembly of claim 1, wherein:
the first part includes at least a first flexible tab having a first aperture;
the second part includes a first detent received by the first aperture.

8. A method of assembling a current transformer assembly comprising:
disposing a current transformer between a first part and a second part of an insulation enclosure, the current transformer having a core and a first coil in a flux inducing relationship with the core, the core including an opening defining a void configured to receive at least a second coil; and
mechanically coupling the first part to the second part to substantially encapsulate the current transformer such that an interior portion of the insulation enclosure is disposed between the core and void.

9. The method of claim 8 further comprising mechanically coupling the first part to the second part such that sections of the first part and the second part overlap.

10. The method of claim 8 further comprising mechanically coupling the first part to the second part such that sections of the first part and the second part overlap to form an overlapping interior portion of the insulation enclosure.

11. The method of claim 8 wherein mechanically coupling the first part to the second part further comprises snap-fitting features on the first and second part.

12. The method of claim 8, wherein mechanically coupling the first part to the second part further includes moving a first flexible tab of the first part over a first detent of the second part until a first aperture of the first part receives the first detent.

13. An arrangement comprising:
a current transformer having a core and a first coil in a flux inducing relationship with the core, the core including an opening defining a void;
a first current coil passing through the void;
a second current coil passing through the void;
an insulation member disposed between the first current coil and the second current coil, the insulation member structurally separate from the first current coil and the second current coil; and
an insulation cup substantially encapsulating the current transformer such that the insulation cup provides a barrier within the void between the current transformer and the first coil and between the current transformer and the second coil.

14. The arrangement of claim 13 wherein the insulation member extends through the void, and has a width exceeding a width of the first current coil and a width of the second coil.

15. The arrangement of claim 13, wherein the insulation cup comprises a first part and a second part, the first part configured to mechanically couple to the second part such that the first part and the second part substantially encapsulate the current transformer.

16. The arrangement of claim 13 wherein each of the first current coil and second current coil includes an uninsulated conductor portion passing through the void.

17. The arrangement of claim 16 wherein said uninsulated conductor portion comprises a flat copper bar.

18. The arrangement of claim 13 wherein the current transformer is supported by a utility meter housing.

19. The arrangement of claim 18 wherein the insulation member is disposed on the utility meter housing.

20. The arrangement of claim 18, wherein the insulation member has a first end connecting to the utility meter housing and a second end opposite the first end, wherein the insulation member extends through a hole defined by an interior portion of the insulation cup.

* * * * *